United States Patent [19]
Guyot

[11] Patent Number: 5,885,423
[45] Date of Patent: Mar. 23, 1999

[54] CAMMED NUT FOR CERAMICS FASTENING

[75] Inventor: Francois L. Guyot, Milpitas, Calif.

[73] Assignee: LAM Research Corporation, Fremont, Calif.

[21] Appl. No.: 624,987

[22] Filed: Mar. 29, 1996

[51] Int. Cl.[6] .......................... C23C 14/34; C23C 16/00; C23F 1/02; B23P 11/00
[52] U.S. Cl. ............... 204/298.15; 204/298.31; 156/345; 118/715; 118/723 E; 118/728; 29/525.02
[58] Field of Search .................. 204/298.15, 298.31; 156/345; 118/715, 723 E, 723 ER, 725, 728, 729, 730, 731; 29/525.01, 525.02, 592.1, 842

[56] References Cited

U.S. PATENT DOCUMENTS

| | | | |
|---|---|---|---|
| 4,340,462 | 7/1982 | Koch | 204/298.35 |
| 4,891,087 | 1/1990 | Davis et al. | 204/298.31 |
| 4,948,458 | 8/1990 | Ogle | 438/729 |
| 5,200,232 | 4/1993 | Tappan et al. | 427/569 |
| 5,262,029 | 11/1993 | Erskine et al. | 204/298.15 |
| 5,332,443 | 7/1994 | Chew et al. | 118/715 |
| 5,350,479 | 9/1994 | Collins et al. | 156/345 |

*Primary Examiner*—Nam Nguyen
*Assistant Examiner*—Rodney G. McDonald
*Attorney, Agent, or Firm*—Burns, Doane, Swecker & Mathis, L.L.P.

[57] ABSTRACT

In a vacuum processing chamber, a method and apparatus for securing an article to a ceramic plate comprises forming a bore in the ceramic plate, forming a counterbore in the ceramic plate, the counterbore having a center which is offset from a center of the bore, inserting a nut into the counterbore, the nut having a threaded hole therein which is offset from the center of the nut to the same degree that the center of the bore is offset from the center of the counterbore, securing the article to the ceramic plate with a screw which is received into the threaded hole of the nut, and fixing an insulating plug having an outer diameter substantially equal to the diameter of the counterbore in the counterbore adjacent to the nut.

18 Claims, 4 Drawing Sheets

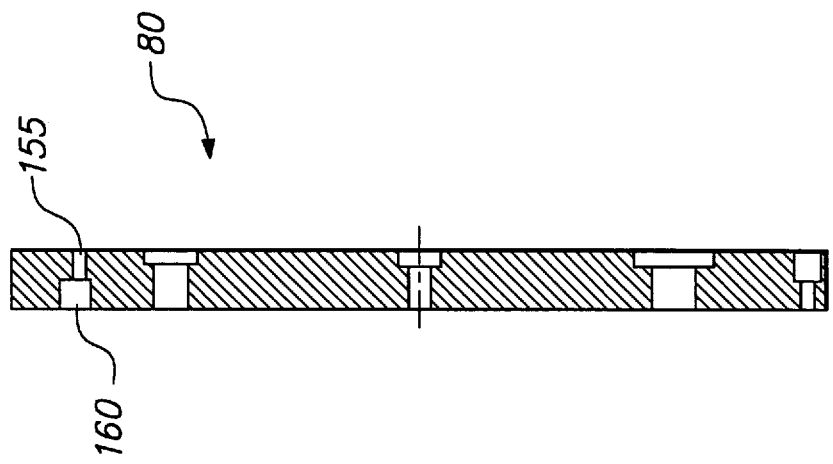
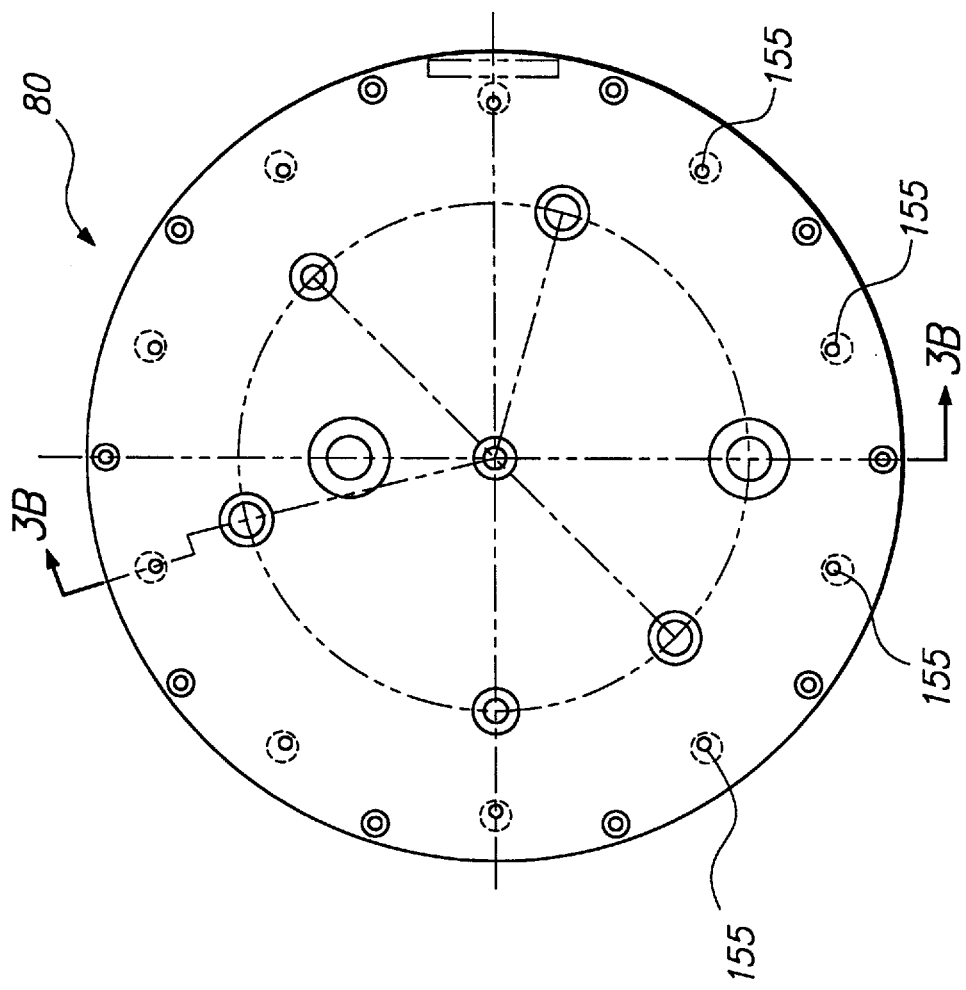

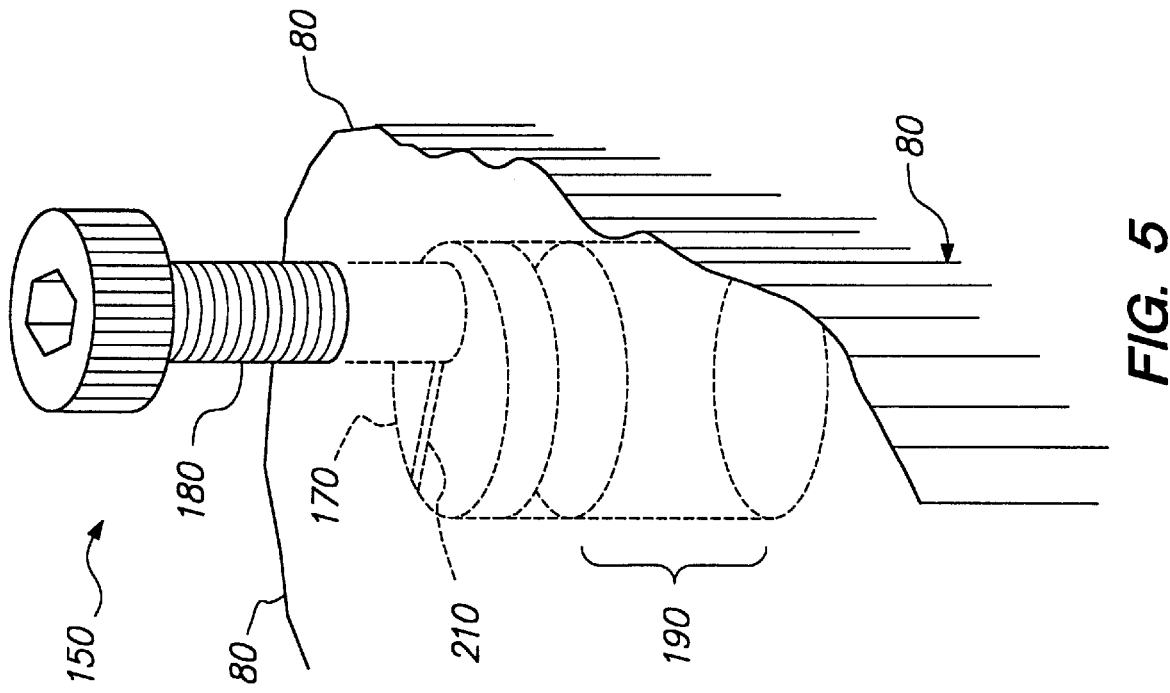
FIG. 5
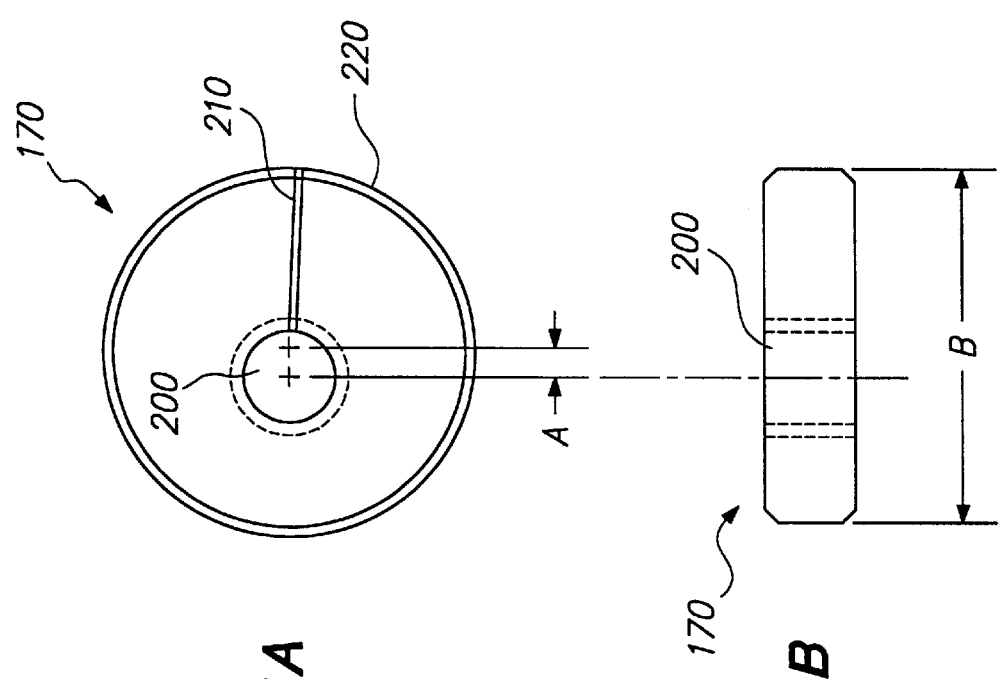
FIG. 4A
FIG. 4B

CAMMED NUT FOR CERAMICS FASTENING

FIELD OF THE INVENTION

The present invention relates generally to an apparatus for securing an article to a ceramic, and more particularly to an apparatus for securing an electrode cap in a vacuum processing chamber to a ceramic insulating plate.

BACKGROUND OF THE INVENTION

Various types of equipment exist for semiconductor processing such as plasma etching, ion implantation, sputtering, rapid thermal processing (RTP), photolithography, chemical vapor deposition (CVD), and flat panel display fabrication processes wherein etching, resist stripping, passivation, deposition, and the like, are carried out. For example, a vacuum processing chamber may be used for etching and chemical vapor deposition of materials on substrates by supplying an etching or deposition gas to the vacuum chamber and application of radio frequencey (RF) energy to the gas. Electromagnetic coupling of RF energy into the source region of a vacuum chamber is conventionally employed to generate and maintain a high electron density plasma having a low particle energy.

Plasma generation is used in a variety of such semiconductor fabrication processes. Plasma generating equipment includes parallel plate reactors such as the type disclosed in commonly owned U.S. Pat. No. 4,340,462, electron cyclotron resonance (ECR) systems such as the type disclosed in commonly owned U.S. Pat. No. 5,200,232, and transformer or inductively coupled plasma (TCP/ICP) systems such as the type disclosed in commonly owned U.S. Pat. No. 4,948,458.

In addition to the RF source which generates the plasma, RF bias energy may be capacitively coupled to the plasma via the article being processed to increase and control the energy of ions impinging on the article. The RF bias power may be capacitively coupled to the plasma via the wafer and chuck. Typically, plasma density is controlled by the RF source power, and ion energy is independently controlled by the RF bias power. To provide the requisite RF fields in the vacuum chamber, the RF source and RF bias generally operate at high voltages.

The high voltage of the RF bias is typically applied to the plasma through an electrode cap in the vacuum processing chamber. Because the cap is powered with a high RF voltage with respect to the electrode housing in the vacuum processing chamber, arcing is likely to occur if there is insufficient spacing between the cap and the grounded housing. Thus, vacuum processing chambers typically include a ceramic insulator plate disposed between the high RF voltage electrode cap and the electrode housing which is at ground potential. The ceramic insulator plate provides the adequate spacing between the electrode cap and the grounded housing to prevent arcing.

A typical method of securing the ceramic insulating plate to the electrode cap is shown in FIG. 1. The method involves threading a hole 10 partway through the ceramic plate 20 (a "blind" hole) and attaching the electrode cap 30 with a screw 40 which is threaded into the blind hole 10. While this method may perform satisfactorily under most conditions, problems can arise, for example, when the ceramic insulator plate 20 is subject to different heating conditions. An uneven heat distribution in the ceramic insulator plate 20 may produce uncontrolled torquing and cause mechanical stresses to develop in the ceramic, with the result that the threads of the blind hole 10 in the ceramic are damaged. Ceramics have a low tolerance for bending moments, which may develop in the threads of the blind hole due to the temperature variations. If even one thread is damaged, the entire ceramic insulating plate, which may include other expensive components, must be replaced.

SUMMARY OF THE INVENTION

According to an exemplary embodiment of the invention, an apparatus for securing an article in a vacuum chamber comprises a ceramic plate having a bore and a counterbore therein, a center of the bore being offset from a center of the counterbore, a cammed nut, disposed in the counterbore, having a threaded hole therein which is offset from a center of the cammed nut to substantially the same degree that the center of the bore is offset from the center of the counterbore, a screw having a first end which secures the article and a second threaded end which is received in the threaded hole of the cammed nut, and an insulating plug which is fixed in the counterbore adjacent to the cammed nut.

An exemplary method for securing a ceramic plate to an article comprises the steps of forming a bore in the ceramic plate, forming a counterbore in the ceramic plate, the counterbore having a center which is offset from a center of the bore, inserting a nut into the counterbore, the nut having an outer circumference substantially equal to a circumference of the counterbore, and a threaded hole therein, wherein a center of the threaded hole is offset from a center of the nut to substantially the same extent that the center of the bore is offset from the center of the counterbore, securing the article to the ceramic plate with a screw which is received into the threaded hole of the nut, and fixing an insulating plug having an outer diameter substantially equal to the diameter of the counterbore in the counterbore adjacent to the nut.

BRIEF DESCRIPTION OF THE DRAWINGS

The foregoing and other objects, features and advantages of the present invention will be more readily understood upon reading the following detailed description in conjunction with the drawings in which:

FIGS. 3a and 3b show a top view and side view of an exemplary ceramic insulator plate;

FIGS. 4a and 4b show a top view and side view of an exemplary cammed nut; and

FIG. 5 shows an exploded view of an exemplary cammed nut assembly which includes a cammed nut, a ceramic plug, a screw and a counterbored hole in the ceramic insulator plate.

DETAILED DESCRIPTION OF THE PREFERRED EMBODIMENTS

Figure 2:
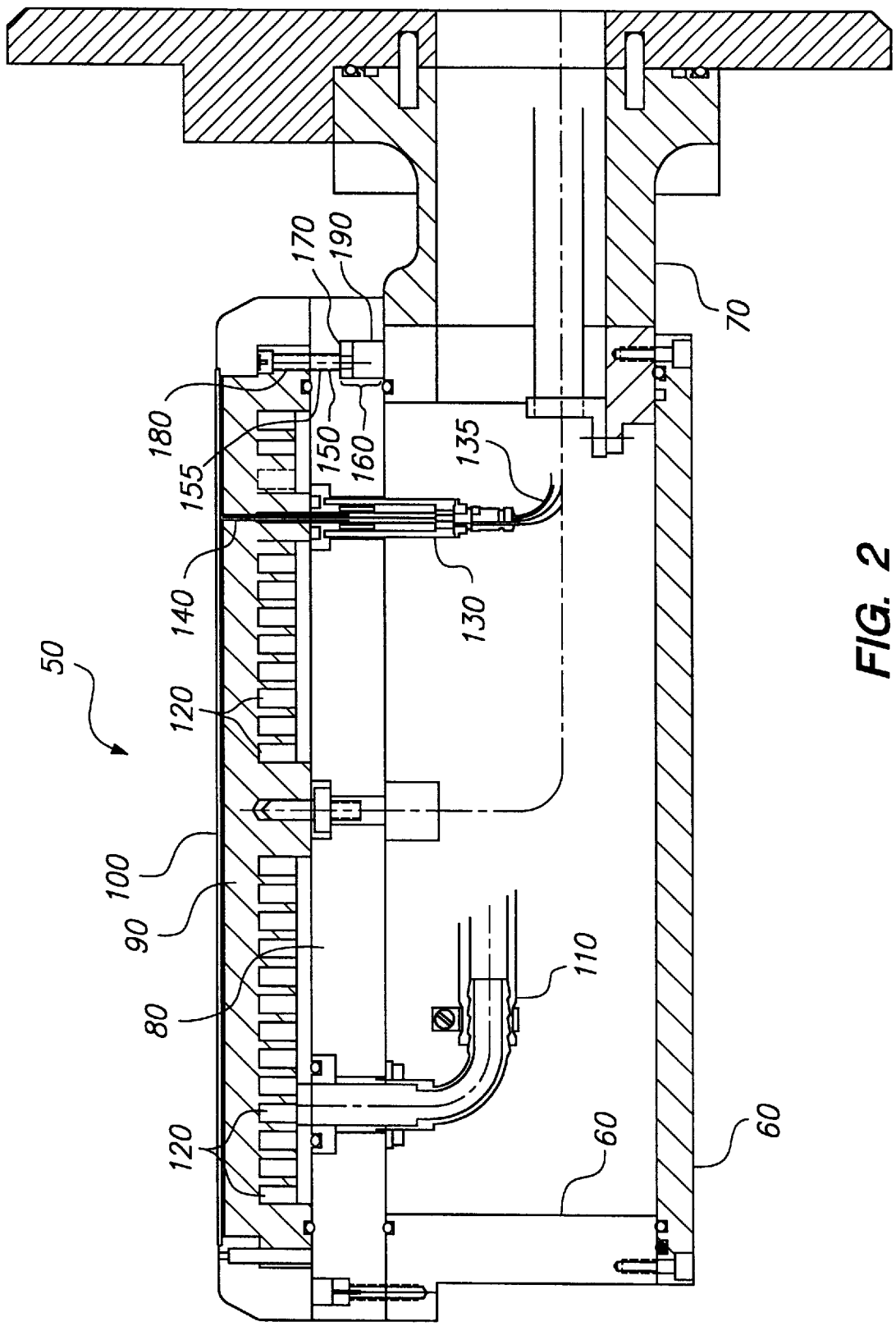
FIG. 2 shows a cross sectional view of a novel electrostatic chuck assembly according to an exemplary embodiment of the invention.

FIG. 2 shows a cross sectional view of an electrode assembly 50 in a vacuum processing chamber. The electrode assembly 50 includes an electrode housing 60 which may be formed of aluminum. The electrode housing 60 is disposed in the vacuum processing chamber and may be supported by a housing neck 70 which fixes the electrode housing 60 to a wall of the vacuum processing chamber. The electrode housing 60 supports a ceramic insulating plate 80, an electrode cap 90, an article to be processed such as a wafer 100, and other components of the electrode assembly. As is well known in the art, a chuck such as an electrostatic chuck (ESC) or a mechanical chuck may be provided to secure the article to be processed to the electrode cap.

The electrode cap 90 provides the RF bias to the plasma in the vacuum processing chamber. The RF bias voltage may be supplied to the electrode cap 90 in any suitable manner, and may be controlled remotely to achieve the desired ion energy in the plasma. Because the electrode cap 90 is typically at a high voltage, arcing is likely to occur between the electrode cap 90 and the electrode housing 60 which is at ground potential, unless sufficient spacing is provided between them. The ceramic plate 80 provides the necessary spacing to prevent arcing, as will be described below in more detail.

The high voltage in the electrode cap 90 which provides the RF bias also generates a substantial amount of heat which may be dissipated by a heat transfer system 110. The heat transfer system 110 may include a series of channels 120 in which a cooling fluid is circulated to transfer heat generated in the electrode cap 90 outside of the vacuum processing chamber. The heat transfer system 110 serves the important function of maintaining the article to be processed within an acceptable temperature range so as not to interfere with the processes performed on the article.

Typically, in a vacuum processing operation, wafers are transported between one or more processing stations to perform different processes on the wafer. To assist in the transfer of the wafer, a pin lifter 130 may be employed. In conventional designs, the pin lifter consists of three or four narrow cylindrical pins attached to a small platform which is raised and lowered to raise and lower the pins. The pin lifter assembly is housed within the electrode cap at the center of the electrode cap with cylindrical holes in the electrode cap containing the pins. Upon completion of processing, the pins are raised in their respective cylindrical holes to contact the underside of the wafer to raise the wafer so that a robotic arm may inserted beneath the wafer to transport the wafer to a different processing station.

Although the conventional pin lifter assembly works adequately for small wafers, as the size of the wafer increases, the stability of the wafer on the four centrally located pins decreases, particularly if there are residual static charges. In FIG. 2, a novel pin lifter design 130 is shown to overcome this problem. To increase the stability of the wafer on the pins 140, each pin (only 1 of 3 is shown in FIG. 2) is spaced apart from the others toward the periphery of the wafer 100. Moreover, by independently controlling each pin 140 with a cable and sleeve assembly 135, used for example in bicycle gear shifting, it is not necessary to include a large platform or yoke within the electrode cap 90, as used in conventional designs, to lift the pins 140 simultaneously. More details of the novel pin lifter assembly are found in commonly owned, copending U.S. Application No. 08/623,880 now U.S. Pat. No. 5,796,066, filed concurrently herewith and which is hereby incorporated by reference.

Figure 1:
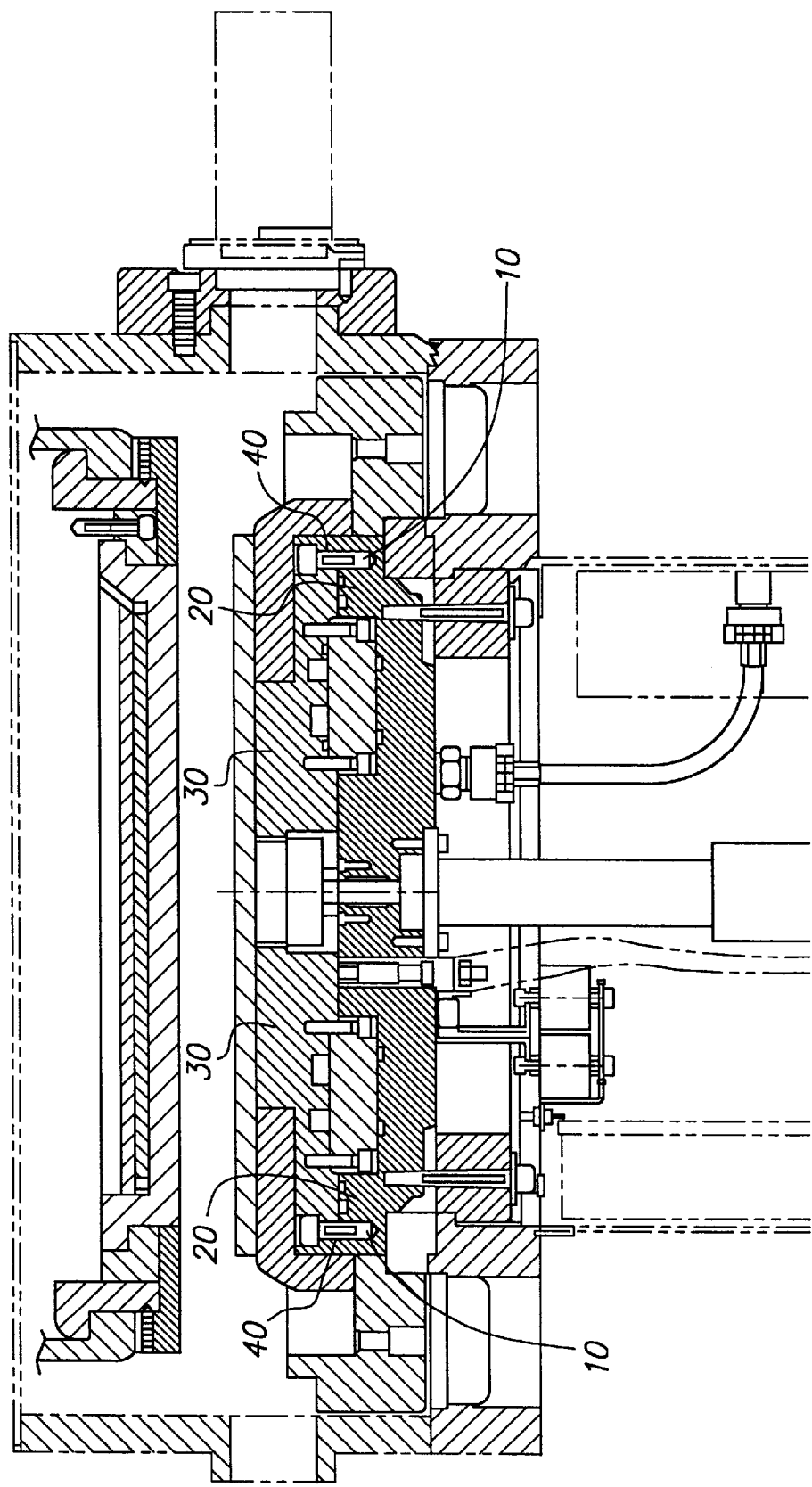
FIG. 1 shows a conventional electrostatic chuck assembly which includes a ceramic insulator plate with blind holes.

The pin lifter 130 and other components of the vacuum processing chamber such as the heat transfer system 110 are integrated with the design of the ceramic insulator 80, as shown in FIG. 2. Thus, it is time consuming and expensive to replace the ceramic insulator 80 in the event that it is damaged. As described above with reference to FIG. 1, in conventional designs, the electrode cap is attached to the ceramic insulating plate by threading a blind hole partway through the ceramic insulating plate. The design according to exemplary embodiments of the present invention can be used to obviate or retrofit a damaged ceramic insulator plate 80 having threaded holes (e.g., damage to the ceramic threads) by employing a design which includes a counterbored hole in the ceramic insulator, a cammed nut which is disposed in the counterbore of the counterbored hole, and a screw which is received in the cammed nut.

FIG. 2 shows one of several cammed nut assemblies 150 which are used to securely attach the electrode cap 90 to the ceramic insulator 80. As shown in FIG. 2, the ceramic insulator 80 includes a counterbored hole 155 having a counterbore 160 in which the cammed nut 170 sits. The screw 180 passes through the electrode cap 90 and into the cammed nut 170 to fix the electrode cap 90 to the ceramic insulating plate 80. An insulating plug 190 having a diameter substantially equal to the diameter of the counterbore 160 is provided beneath the cammed nut 170 in the counterbore 160. The insulating plug 190 is preferably formed of a ceramic material.

FIG. 3(a) is a top view of an exemplary ceramic insulating plate 80 which includes ten counterbored holes 155 as well as other holes for receiving various components and for attaching the ceramic insulator plate 80 to the grounded electrode housing 60. FIG. 3(b) is a cross sectional view of the ceramic insulating plate 80 of FIG. 3(a). As shown in FIG. 3(b), a bore 155 with an offset counterbore 160 is provided to secure the ceramic plate to the electrode cap.

FIG. 4 shows a top view of an exemplary cammed nut 170 which is disposed within the counterbore 160 of the counterbored hole 155 and which receives the screw 180. The threaded hole 200 in the cammed nut 170 is preferably offset from the center of the cammed nut 170 so that when the screw 180 is threaded into the hole 200, the cammed nut 170 cannot rotate within the counterbore 160. Those skilled in the art will also readily appreciate that other designs can be used to prevent rotation of the nut in the counterbore, for example a square, hexagonal, oval, or other noncircular nut in a similarly shaped hole.

According to a preferred embodiment, the cammed nut has a split 210 which extends from the threaded hole 200 to the outside edge 220 of the cammed nut 170, as shown in FIG. 4(a). The split 210 allows the cammed nut 170 to exert a spring bias pressure against the counterbore 160 of the counterbored hole 155 in the ceramic plate 80. For example, the cammed nut 170 can be split and pre-expanded at the split so that it will be press fit against the wall of the counterbore 160. The positioning of the cammed nut 170 in plate 80 should be preserved even after removal of the screw 180 absent forces which overcome the wall friction to induce rotation or push the cammed nut 170 out of the counterbore 160.

FIG. 5 shows an exploded view of the cammed nut assembly 150 which includes the screw 180, the cammed nut 170, and the ceramic plug 190. The ceramic plug 190 occupies the depth of the counterbore 160 not occupied by the cammed nut 170, as shown most clearly in FIG. 2. The ceramic plug 190 provides insulation between the screw 180 and nut 170 (both of which can be of an electrically conductive material) and the grounded electrode housing 60. Room temperature vulcanizing (RTV) silicones, or any other comparable material, can be used to seal the ceramic plug in the counterbore 160 to increase its insulating capacity. Thus, a dab of RTV can be placed over the ceramic plug 190 which is pushed into the counterbore 160. The RTV displaces laterally and seals the ceramic insulator 80 against RF fields generated by the electrode cap 90.

The cammed nut 170 and the screw 180 may be formed of any suitable material, such as stainless steel or aluminum. However, the material used to form the cammed not 170 is preferably different from the material used to form the screw 180. By using different materials, the danger of the screw 180 fusing to the cammed nut 170 is eliminated. According to a preferred embodiment, the nut 170 is formed of stainless steel and the screw 180 comprises a nickel/stainless steel alloy.

As will be recognized by those skilled in the art, the present invention provides many important advantages over prior art designs. For example, the cammed nut/screw arrangement can be used to retrofit a ceramic plate having threaded blind holes by providing counterbored holes in the ceramic plate in accordance with the invention. The cammed nut assembly 150 is inherently simple to machine, and provides a secure fastening arrangement which does not weaken the ceramic insulating plate 80. The cammed nut assembly 150 also reduces parts count at the assembly level since the nut 170 has been sealed in its counterbore 160 and covered with the insulating plug 190 before assembly. It is not permanent like a solder joint, but is semi-permanent and therefore allows replacement of cross threaded nuts 170. It is very strong and allows temperature cycling. It allows very high holding power without being affected by the brittleness of the ceramic 80. If the cammed nut 170 is made of a higher tensile strength than the screw 180, the screw 180 will break before either the cammed nut 170 or the ceramic 80. Finally, it is RF proof.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. An apparatus for securing an article comprising:
    a ceramic plate having a bore and a counterbore therein, the counterbore being larger in diameter than the bore and a center of the bore being offset from a center of the counterbore;
    a cammed nut, disposed in the counterbore, the cammed nut having a threaded hole therein which is offset from a center of the cammed nut to substantially the same degree that the center of the bore is offset from the center of the counterbore; and
    a screw having a first end which secures the article and a second threaded end which is received in the threaded hole of the cammed nut.

2. An apparatus for securing an article comprising:
    a ceramic plate having a bore and a counterbore therein, the counterbore being larger in diameter than the bore and a center of the bore being offset from a center of the counterbore;
    a cammed nut, disposed in the counterbore, the cammed nut having a threaded hole therein which is offset from a center of the cammed nut to substantially the same degree that the center of the bore is offset from the center of the counterbore; and
    a screw having a first end which secures the article and a second threaded end which is received in the threaded hole of the cammed nut, the cammed nut including a slit extending from the threaded hole to an outside edge of the cammed nut.

3. The apparatus of claim 2, wherein the outer diameter of the cammed nut is pre-expanded with the slit to provide friction between the outer circumference of the cammed nut and the counterbore.

4. The apparatus of claim 1, wherein the screw comprises a nickel alloy or stainless steel alloy and the cammed nut comprises stainless steel.

5. An apparatus for securing an article comprising:
    a ceramic plate having a bore and a counterbore therein, the counterbore being larger in diameter than the bore and a center of the bore being offset from a center of the counterbore;
    a cammed nut, disposed in the counterbore, the cammed nut having a threaded hole therein which is offset from a center of the cammed nut to substantially the same degree that the center of the bore is offset from the center of the counterbore;
    a screw having a first end which secures the article and a second threaded end which is received in the threaded hole of the cammed nut; and
    an insulating plug which is fixed in the counterbore adjacent to the cammed nut.

6. The apparatus of claim 5, wherein the insulating plug is fixed in the counterbore with silicone.

7. An apparatus for securing an article comprising:
    a ceramic plate having a bore and a counterbore therein, the counterbore being larger in diameter than the bore and a center of the bore being offset from a center of the counterbore;
    a cammed nut, disposed in the counterbore, the cammed nut having a threaded hole therein which is offset from a center of the cammed nut to substantially the same degree that the center of the bore is offset from the center of the counterbore; and
    a screw having a first end which secures the article and a second threaded end which is received in the threaded hole of the cammed nut, the article comprising an electrode of a substrate support for supporting substrates in a vacuum chamber.

8. The apparatus of claim 1, wherein the article comprises a component of a substrate support located in a plasma processing chamber.

9. The apparatus of claim 1, wherein the article comprises a component within a vacuum chamber.

10. An apparatus for securing an article comprising:
    a ceramic plate having a bore and a counterbore therein, the counterbore being larger in diameter than the bore and the counterbore having a noncircular outer circumference;
    a nut, disposed in the counterbore, the nut having an outer circumference which is substantially the same shape as the non-circular shape of the counterbore;
    a screw having a first end which secures the article and a second threaded end which is received in a threaded hole of the nut; and
    an insulating plug having an outer circumference which is substantially the same shape as the non-circular shape of the counterbore, the insulating plug being fixed in the counterbore adjacent to the nut.

11. A method of securing the ceramic plate to the article recited in claim 1, comprising the steps of:
    inserting the cammed nut into the counterbore;
    securing the article to the ceramic plate with the screw which is received into the threaded hole of the nut; and
    fixing an insulating plug having an outer diameter substantially equal to the diameter of the counterbore in the counterbore adjacent to the nut.

12. The method of claim 11, wherein the step of fixing the insulating plug comprises injecting silicone into the counterbore adjacent to the insulating plug.

13. The method of claim 11, further comprising the step of providing a slit in the cammed nut which extends from the threaded hole to an outer edge of the cammed nut.

14. The method of claim 13, further comprising the step of pre-expanding the outer circumference of the cammed nut prior to inserting the cammed nut in the counterbore.

15. The method of claim 11, wherein the article comprises a component of a substrate support, the component including a plurality of holes therein and the ceramic plate including a plurality of bores and offset counterbores, the method including attaching the component to the substrate support by placing a plurality of screws through the holes of the component and into the bores of the ceramic plate, threading the screws into nuts in the counterbores and tightening the screws.

16. The method of claim 15, wherein the component comprises an electrode cap and the ceramic plate is supported on a housing of the substrate support used for supporting a substrate in a plasma processing chamber, the electrode cap including the plurality of holes, the bores in the ceramic plate facing the electrode cap and the offset counterbores facing away from the electrode cap.

17. The method of claim 16, wherein the nuts have threaded holes therein having central axes offset from centers of the nuts, the method including aligning the threaded holes in the nuts with the bores in the ceramic plate prior to threading the screws into the nuts.

18. The method of claim 16, wherein the nuts are split nuts which have been expanded, the method including compressing the split nuts and inserting the compressed split nuts in the counterbores.

* * * * *